United States Patent [19]

Young et al.

[11] Patent Number: 4,837,443
[45] Date of Patent: Jun. 6, 1989

[54] GUARD RING FOR A DIFFERENTIALLY PUMPED SEAL APPARATUS

[75] Inventors: Lydia J. Young, Palo Alto; Glen E. Howard, Pleasanton, both of Calif.

[73] Assignee: The Perkin-Elmer Corporation

[21] Appl. No.: 109,883

[22] Filed: Oct. 15, 1987

[51] Int. Cl.$^4$ .......................... G01F 21/00; G21K 5/08
[52] U.S. Cl. ................................. 250/441.1; 250/440.1
[58] Field of Search .......................... 250/440.1, 441.1; 219/121 EN, 121 EQ

[56] References Cited

U.S. PATENT DOCUMENTS

| | | | |
|---|---|---|---|
| 4,563,587 | 1/1986 | Ward et al. | 250/396 R |
| 4,563,924 | 1/1986 | Runkle et al. | 29/DIG. 63 |
| 4,571,850 | 2/1986 | Hunt et al. | 34/133 |
| 4,584,479 | 4/1986 | Lamattina et al. | 250/441.1 |
| 4,607,167 | 8/1986 | Petrie | 250/441.1 |
| 4,669,226 | 6/1987 | Mandler | 51/216 LP |

*Primary Examiner*—Bruce C. Anderson
*Attorney, Agent, or Firm*—Thomas P. Murphy; Edwin T. Grimes; Paul A. Fattibene

[57] ABSTRACT

Disclosed is a guard ring (20) in a particle beam lithography system (10) of a pressurized gas surrounding a seal apparatus (14) and concentric therewith so that the guard ring (20) of gas is located between the seal apparatus (14) and ambient pressure in which the remainder of the workpiece (12) is located and forms a curtain of gas surrounding the seal apparatus (14) to reduce contamination of the seal apparatus (14) and beam column (16). In one embodiment, the guard ring (20) is formed by a ring of small ports (60) connected to a source of pressurized gas so that gas at a pressure higher than the ambient pressure is directed toward the workpiece (12). In a second embodiment, the guard ring (20) is formed by a small width groove (72) connected by gas ports (60) to a source of pressurized gas (64) by which gas is introduced into the groove (72). In a third embodiment, the guard ring (20) is formed by a plurality of gas ports (60) and counterbores (74) connected to a source of pressurized gas (64) by which gas is introduced into said counterbores (74). Both the groove (72) and the counterbores (74) serve to distribute the emitted pressurized gas. The emitted pressurized gas may be filtered dry air or gas, or an inert or an ionized gas, all of which may be preheated.

8 Claims, 2 Drawing Sheets

GUARD RING FOR A DIFFERENTIALLY PUMPED SEAL APPARATUS

BACKGROUND OF THE INVENTION

1. Related Application

U.S. patent application of L. Young entitled "Differentially Pumped Seal Apparatus" Ser. No. 062,038 filed 06/15/87.

2. Field of Invention

This invention relates to an improvement in systems having a differentially pumped seal apparatus such as in a particle beam lithography system.

3. Prior Art

U.S. Pat. No. 4,524,261 of Petric et al entitled "Localized Vacuum Processing Apparatus" (hereinafter called the '261 patent) and U.S. Pat. No. 4,528,451 of Petric et al entitled "Gap Control System for Localized Vacuum Processing" (hereinafter called the '451 patent).

The use and advantages of a localized vacuum processing apparatus (hereinafter called a seal apparatus) in a particle beam lithography system for treating a workpiece (substrate), such as a semiconductor wafer or mask, by a particle beam are disclosed in the '261 patent and the need for controlling of the gap length (size) between the tip of the seal apparatus and the workpiece are disclosed in the '451 patent.

The seal apparatus of the '261 patent comprises a housing member with centrally located sleeves forming concentric apertures connected to vacuum pumps to create zones of radially inwardly increasing vacuum with the center most aperture being at highest vacuum. In this manner, only the area of the workpiece proximate the sleeves is subjected to vacuum while the rest of the workpiece surface is at ambient pressure. The gap between the tips of the sleeves and the workpiece surface is important, and the '451 patent discloses a sensing and feedback control system for continuously monitoring and changing the gap length so as to be within a selected range by moving the workpiece up and down during workpiece processing. In the '261 patent, as well as in the '451 patent, the workpiece is moved transversely of the seal apparatus to treat the workpiece in an otherwise conventional manner.

The seal apparatus of the '261 patent was improved by the differentially pumped seal apparatus disclosed and claimed in the Young application, supra, by providing higher conductance and better pump efficiencies and operating with a much smaller gap between the workpiece and the seal apparatus. Otherwise, the operation of both apparatus is similar in a particle beam lithography system. That is to say, the workpiece is subjected to vacuum proximate the concentric sleeves and the remainder of the workpiece is at ambient pressure and the workpiece is moved transversely of the sleeves during workpiece processing.

In either case, since the area of the workpiece surface beneath the concentric sleeves is at low pressure and the innermost aperture is open to the beam column, while the remainder of the workpiece surface is at ambient pressure, there is a possibility of contaminants coming in contact with the workpiece surface and entering the beam column and this invention is directed toward reducing this possibility.

SUMMARY OF THE INVENTION

The invention which reduces the above mentioned possibility of contamination comprises a guard ring of pressurized gas surrounding the seal apparatus and concentric therewith so that the ring of gas is located between the seal apparatus and ambient pressure. In one embodiment, the guard ring is formed by a ring of small ports connected to a source of pressurized gas so that gas under a pressure higher than ambient pressure is emitted and directed toward the workpiece surface. The expanding and overlapping emitted gas forms a curtain of gas. In a second embodiment, the guard ring is formed by a small width groove connected by gas ports to a source of pressurized gas by which gas is introduced into the groove. In a third embodiment, the guard ring is formed by a plurality of counterbores on gas ports connected to a source of gas under pressure by which gas under pressure by which gas under pressure is introduced into the counterbores. Both the groove and the counterbores serve to distribute the emitted pressurized gas to form the curtain of gas and to facilitate removal of debris on the surface of the workpiece. The emitted pressurized gas may be filtered dry air or gas, or an inert or an ionized gas, all of which may be preheated.

It will be apparent to those skilled in the art after having studied the accompanying drawings and having reviewed the following Detailed Description that the guard ring can reduce the number and type of contaminants contacting the workpiece surface and entering the differential pumping seal, and hence the column, through the use of near contamination-free (i.e. filtered and dried) gas. If a clean, ionized gas is used, then not only is the number of introduced contaminants minimized, but also contaminants already existing on the workpiece surface may be removed by electrostatic means (i.e. via the ionized gas). Additionally, by preheating the incoming gas, the guard ring may serve to moderate the localized temperature differential that may arise in the workpiece from the differential pumping.

Finally, if an appropriate inert gas were chosen and its partial pressure controlled, the localized vacuum processing apparatus no longer becomes limited to the purposes of particle beam lithography, but rather can be used to perform other types of microanalysis, such as for example, Auger spectroscopy.

DETAILED DESCRIPTION

Figure 1:
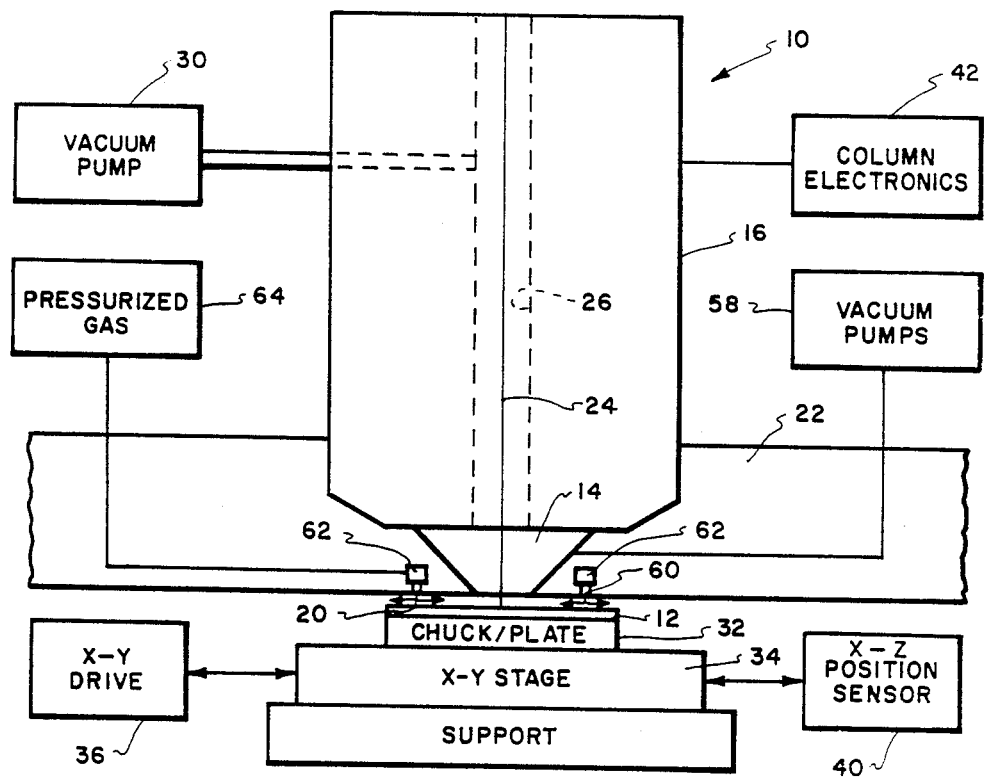
FIG. 1 is a schematic block diagram of a particle beam lithography system incorporating one embodiment of the present invention.
Figure 2:
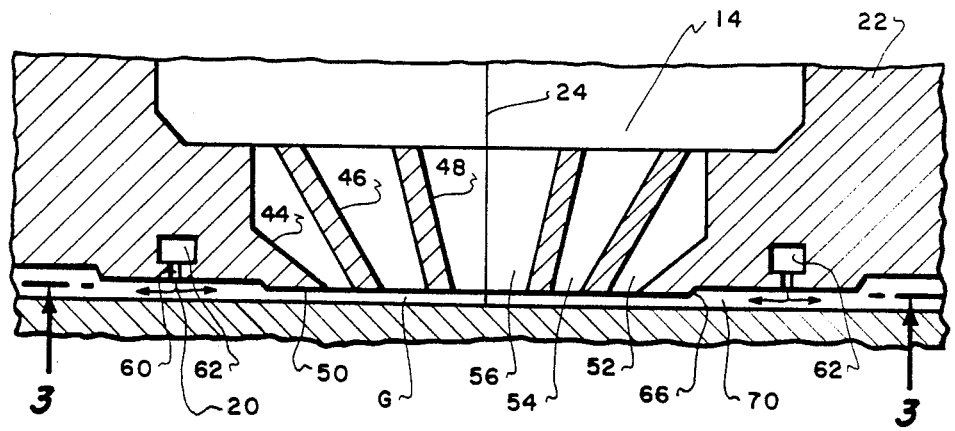
FIG. 2 is an enlarged cross-sectional view of a portion of the seal apparatus of FIG. 1 and one embodiment of the guard ring.

Turning now first to FIGS. 1 and 2, the block diagram of FIG. 1 illustrates a particle beam lithography system 10 for processing a workpiece 12, also called a substrate, such as a semiconductor wafer or mask. This particle beam lithography system 10 also includes a seal apparatus 14 located at the output of a beam column 16 and further includes a guard ring 20 of this invention surrounding the seal apparatus 14. The seal apparatus 14 and guard ring 20 are formed in a large plate 22, called a manifold, on which the beam column 16 is mounted.

The beam column 16 includes an electron or ionized particle source, demagnification optics and projection and deflection optics which generate a finely focused beam 24 and may also include illumination and shaping optics when a shaped beam is utilized. A central tube 26 (shown in phantom) is within the column 16 and is traversed by the beam 24 and maintained at a high vacuum by a high vacuum pump 30 coupled to the column 16. The beam 24 passes through the seal apparatus 14 and impinges on the workpiece 12. The workpiece 12 is supported on a vacuum chuck 32 and held in position on a movable stage 34 which is translated in an X-Y direction by an X and Y axis drive system 36 and the position of the stage is sensed by X and Y position sensors 40 which are typically laser interferometers. The X and Y axis define a horizontal plane while the Z axis coincides with the axis of the beam. The complete lithography system 10 further includes a computer (controller), and associated electronics which controls the beam, the drive system, the vacuum system, the substrate handling system and stores pattern data and provides beam control signals; all identified by a block diagram 42.

The seal apparatus 14 includes a plurality of conical shaped sleeves 44, 46 and 48, partially shown in FIG. 2, which terminate in a generally planar tip 50 positioned, during processing, slightly above the workpiece 12. As shown, the sleeve 44 of this embodiment is part of the manifold 22. The position of the tip relative to the workpiece 12 is referred to as a gap, and identified as G, and is important to the operation of the seal apparatus and the graded seal obtained thereby. Reference is made to the '451 patent, supra, where means for controlling the gap is disclosed.

The sleeves define a plurality of concentric apertures 52, 54 and 56 coupled to first, second and third stage pumps, identified only as a block diagram 58, which reduce the pressure from ambient to a first vacuum level at aperture 52, a second vacuum level of an intermediate value at aperture 54 and a third or high vacuum level at central aperture 56 corresponding to the vacuum in the central tube 26. The beam 24 is scanned over the region of the workpiece within the central aperture 56 as the workpiece moves horizontally relative to the aperture 56.

The construction of the seal apparatus 14 which accomplishes a better reduction in vacuum and a smaller gap size than that of the prior art seal apparatus of the '261 patent is the preferred seal apparatus to be used and, if more detailed information concerning the preferred seal apparatus is necessary, reference is made to the Young application, supra.

As is apparent from the description of the particle beam lithography system 10 thus far, air at ambient pressure is gradually reduced in steps, sometimes called a radial graded reduction, to a high vacuum level at the central aperture 56 which means that there is a possibility of contaminants in the atmosphere and/or on the workpiece 12 to be sucked into the central aperture 56 and beam column 16. To reduce, or avoid this possibility, the guard ring 20 of this invention is incorporated into the particle beam lithography system 10 and will now be described in more detail.

Turning again to FIGS. 1, 2 and 3, but more specifically to FIGS. 2 and 3, it can be seen that there is a series of ports 60 disposed in a circle of greater radius than the radii of the concentric apertures 52, 54 and 56 and concentrically about and spaced from the seal apparatus 14. Each of these ports 60 is connected to an inner manifold 62 which, in turn, is coupled to a source of pressurized gas 64 so that gas under a pressure higher than ambient pressure is introduced into the inner manifold 62 and directed out the ports 60 and toward the workpiece 12. As shown in FIGS. 1 and 2, this emitted gas splits at or near the workpiece surface 12 in two directions; one direction toward the seal apparatus 14 and the other direction outwardly toward that part of the workpiece surface 12 which is at ambient pressure. The spacing between the port 60, and consequently their number, is selected so that the emitted and expanding gas from each port overlaps and forms a curtain of gas surrounding the apertures 52, 54 and 56. With this guard ring of clean dry gas, under pressure, the likelihood of contaminants entering the beam column 16 is measureably reduced. It should be apparent also that, if this gas is ionized, the combination of the pressurized gas being both clean and dry and ionized may also aid in removing already existing contaminants on the workpiece surface thus reducing the number of contaminants that may be lodged on the workpiece surface. Also, if the gas of this guard ring is preheated, the temperature of the workpiece in the area of the seal apparatus may be controlled.

FIG. 2 also illustrates a step 66 formed in the manifold 22 to provide the guard ring with a gap 70 which is larger (about 25 to 50 microns) than the optimum operating gap (about 12 to 15 microns) beneath the seal apparatus.

Figure 3:
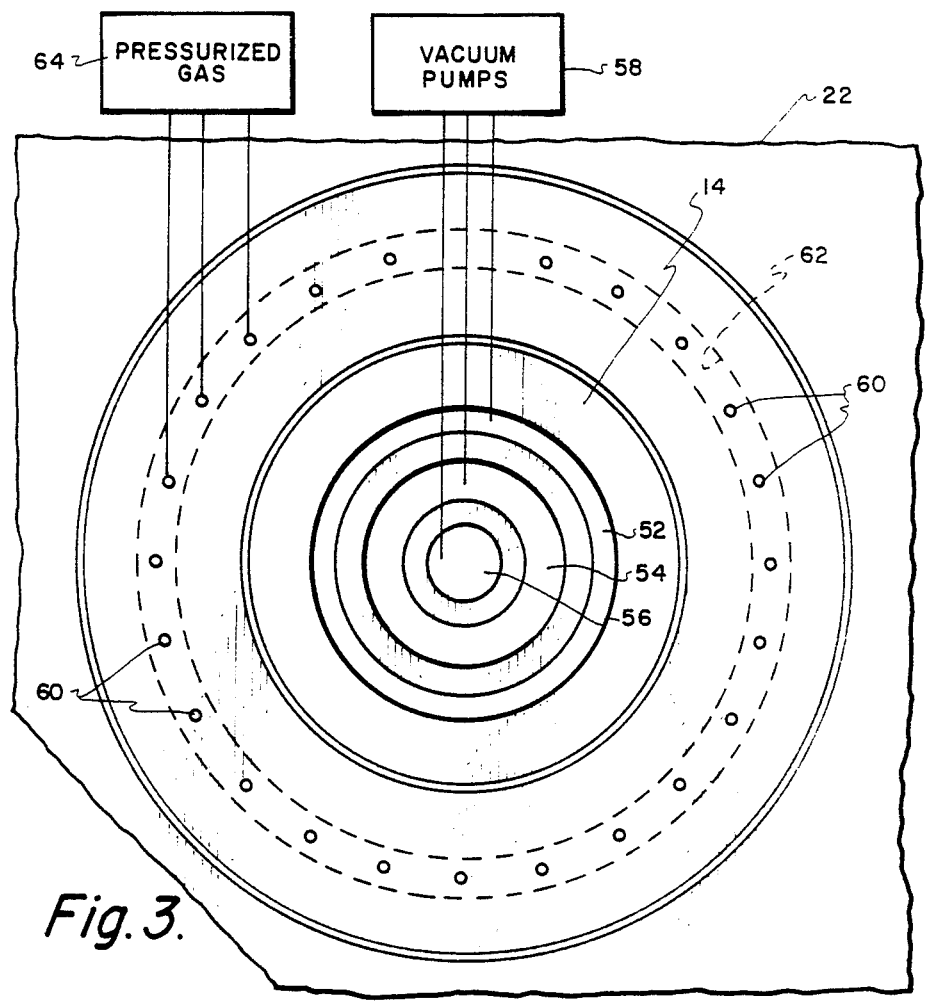
FIG. 3 is a plan view, taken along line 3—3 of FIG. 2, and showing the seal apparatus with the guard ring of FIGS. 1 and 2.
Figure 4:
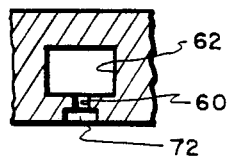
FIG. 4 is partial cross-sectional view of an another embodiment of the guard ring.
Figure 5:
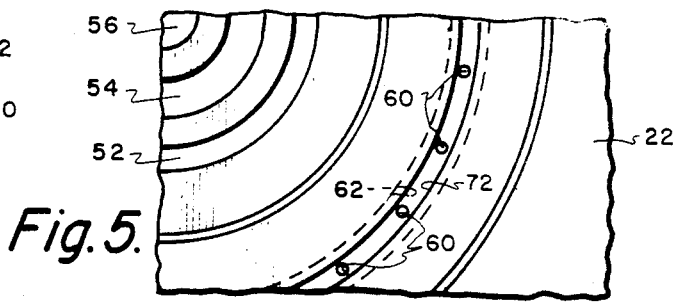
FIG. 5 is a partial plan view, like FIG. 3, showing the seal apparatus and the guard ring of FIG. 4.

FIGS. 4 and 5 illustrate another embodiment of the guard ring 20 and differs from the embodiment of figures 1, 2 and 3 in that there is a circular groove 72 formed in the manifold 22 concentrically with the seal apparatus to distribute the emitted expanding gas impinging on the workpiece surface. Due to this distribution of the emitted gas by the groove 72, the number of ports 60 may be less than the number of ports 60 used in the embodiment of FIGS. 1-3 and still form a curtain of gas. The emitted gas may be filtered dry air or gas, or an inert or an ionized gas, all of which may be heated and accomplish the result of the guard ring of FIGS. 1, 2 and 3. As is apparent, those components of this embodiment which perform a similar function as those components in FIGS. 1, 2 and 3, are given the same reference numerals to simplify and shorten its description.

Figure 6:
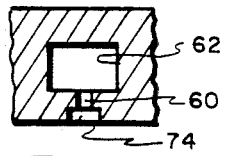
FIG. 6 is a partial cross-sectional view of still another embodiment of the guard ring.
Figure 7:
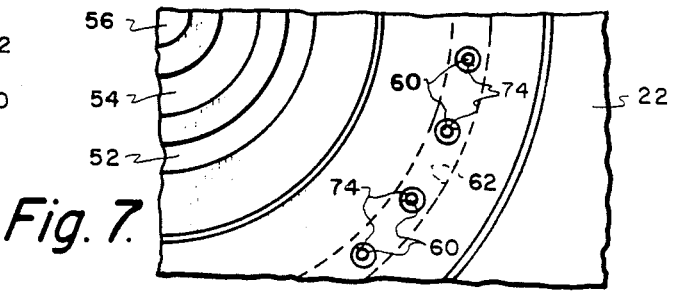
FIG. 7 is a partial plan view, like FIGS. 3 and 5, showing the seal apparatus and the guard ring of FIG. 6.

FIGS. 6 and 7 illustrate still another embodiment of the guard ring 20 and differs from the prior embodiments in that each port 60 exist into a concentric counterbore 74 formed in the manifold 22 to distribute the emitted expanding gas impinging on the workpiece surface. Again, like the embodiment of FIGS. 4 and 5, due to the distribution of the emitted gas by these counterbores 74, the number of ports 60 may be less than the number of ports 60 used in the embodiment of FIGS. 1-3 and still form a curtain of gas. Also, like the prior embodiments, the emitted gas may be filtered dry air or gas, or an inert or an ionized gas, all of which may be preheated to accomplish the result of the guard ring of FIGS. 1–3. As in the prior embodiments, those components of the prior embodiments which perform a similar function are given the same reference numerals to simplify and shorten its description.

We claim:

1. A particle beam lithography system for treating a semiconductor wafer or mask workpiece surface comprising a beam column having means for generating and directing a particle beam toward the workpiece surface,
   a seal apparatus for maintaining only a portion of said workpiece surface in a vacuum so that the beam can be directed to that portion in vacuum while the rest of the workpiece surface is at ambient pressure,
   means for positioning said workpiece with respect to said seal apparatus so that a gap is formed between the seal apparatus and the workpiece during workpiece processing and so that the workpiece can move generally transversely of the beam to enable different portions to be treated by the beam at different times yet maintain the vacuum beneath the seal apparatus, and
   means surrounding said seal apparatus and cooperating with said workpiece surface for reducing the possibility of contaminants entering said seal apparatus and to moderate the localized temperature differential in the area of the workpiece in vacuum which comprises a ring of heated gas under pressure directed toward and impinging on said workpiece surface.

2. The system as claimed in claim 1 wherein said ring of heated gas is formed by a plurality of ports spaced from the workpiece surface and the distance from said ports to said workpiece surface is greater than the size of said gap.

3. The system as claimed in claim 1 wherein said ring of heated gas is formed by a groove connected to a source of pressurized gas and the distance from said groove to said workpiece surface is greater than the size of said gap.

4. The system as claimed in claim 1 wherein said ring of heated gas is formed by a plurality of counterbores connected to a source of pressurized gas and the distance from said counterbores to said workpiece surface is greater than the size of said gap.

5. A particle beam lithography system for treating a semiconductor wafer or mask workpiece surface comprising a beam column having means for generating and directing a particle beam toward the workpiece surface,
   a seal apparatus for maintaining only a portion of said workpiece surface in a vacuum so that the beam can be directed to that portion in vacuum while the rest of the workpiece surface is at ambient pressure,
   means for positioning said workpiece with respect to said seal apparatus so that a gap is formed between the seal apparatus and the workpiece during workpiece processing and so that the workpiece can move generally transversely of the beam to enable different portions to be treated by the beam at different times yet maintain the vacuum beneath the seal apparatus, and
   means surrounding said seal apparatus and cooperating with said workpiece surface for reducing the possibility of contaminants entering said seal apparatus and to electrostatically dislodge any contaminants from said workpiece surface which comprises a ring of ionized gas under pressure directed toward and impinging on said workpiece surface.

6. The system as claimed in claim 5 wherein said ring of ionized gas is formed by a plurality of ports spaced from said workpiece surface and the distance from said ports to said workpiece surface is greater than the size of said gap.

7. The system as claimed in claim 5 wherein said ring of ionized gas is formed by a groove connected to a source of pressurized gas and the distance from said groove to said workpiece surface is greater than the size of said gap.

8. The system as claimed in claim 5 wherein said ring of ionized gas is formed by a plurality of counterbores connected to a source of pressurized gas and the distance from said counterbores to said workpiece surface is greater than the size of said gap.

* * * * *